(12) United States Patent
Otremba et al.

(10) Patent No.: US 9,748,116 B2
(45) Date of Patent: Aug. 29, 2017

(54) ELECTRONIC DEVICE AND METHOD OF MANUFACTURING THE SAME

(71) Applicant: Infineon Technologies Austria AG, Villach (AT)

(72) Inventors: Ralf Otremba, Kaufbeuren (DE); Ulrich Froehler, Nersingen (DE); Felix Grawert, Villach (AT); Ernst Katzmaier, Villach (AT); Uwe Kirchner, Feldkirchen (AT); Rene Mente, Riegersdorf (AT); Andreas Schloegl, Ottobrunn (DE); Uwe Wahl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/200,120

(22) Filed: Jul. 1, 2016

(65) Prior Publication Data
US 2017/0005025 A1 Jan. 5, 2017

(30) Foreign Application Priority Data
Jul. 2, 2015 (DE) .................. 10 2015 110 655

(51) Int. Cl.
| H01L 23/495 | (2006.01) |
| H01L 21/56 | (2006.01) |
| H01L 23/31 | (2006.01) |
| H01L 23/373 | (2006.01) |

(52) U.S. Cl.
CPC .......... *H01L 21/56* (2013.01); *H01L 23/3135* (2013.01); *H01L 23/3737* (2013.01); *H01L 23/49562* (2013.01); *H01L 2224/48091* (2013.01); *H01L 2224/48247* (2013.01); *H01L 2224/49111* (2013.01)

(58) Field of Classification Search
CPC ............ H01L 23/3675; H01L 23/3135; H01L 23/49503; H01L 23/49541; H01L 21/56
USPC .......................................................... 257/675
See application file for complete search history.

(56) References Cited

U.S. PATENT DOCUMENTS

| 2006/0223199 A1* | 10/2006 | Ando ............... H01L 21/76898 438/3 |
| 2013/0141920 A1* | 6/2013 | Emerson .............. H01L 33/486 362/311.01 |
| 2013/0307135 A1 | 11/2013 | Ueda et al. |

FOREIGN PATENT DOCUMENTS

| DE | 19543920 A1 | 5/1997 |
| DE | 19732625 A1 | 2/1998 |
| DE | 10149093 A1 | 8/2002 |
| DE | 102013106113 A1 | 12/2013 |

* cited by examiner

Primary Examiner — Tu-Tu Ho

(57) ABSTRACT

Various embodiments provide an electronic device, wherein the electronic device comprises a mounting surface configured to mount the electronic device to an external structure and having a first size; a backside electrode having a second size and having arranged thereon a die electrically connected to the backside electrode; wherein the first size is at least three times the second size.

7 Claims, 2 Drawing Sheets

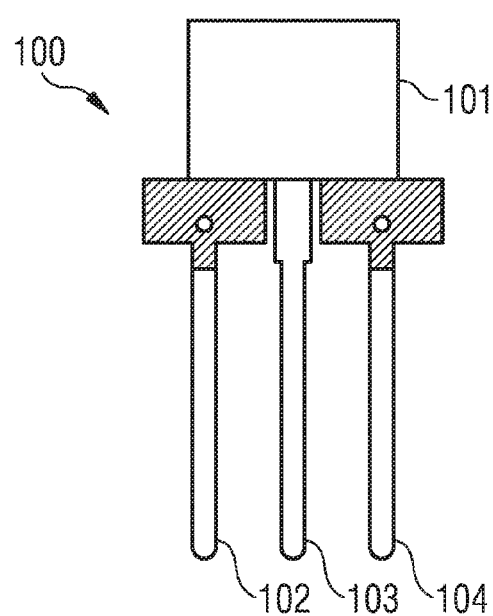
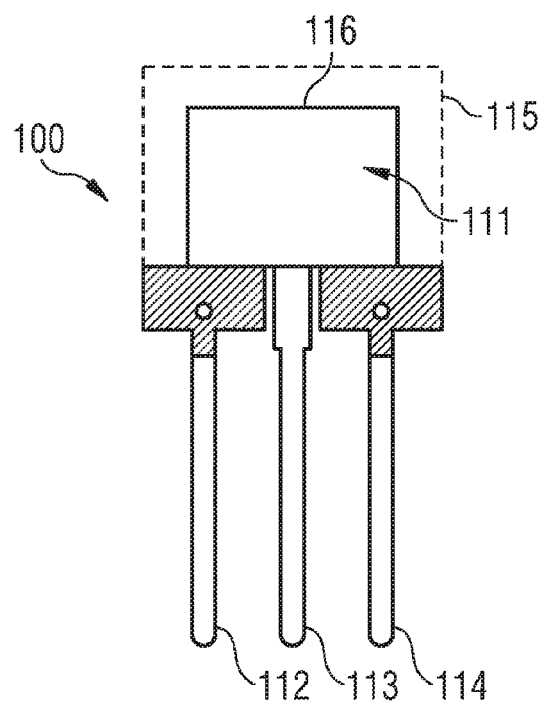
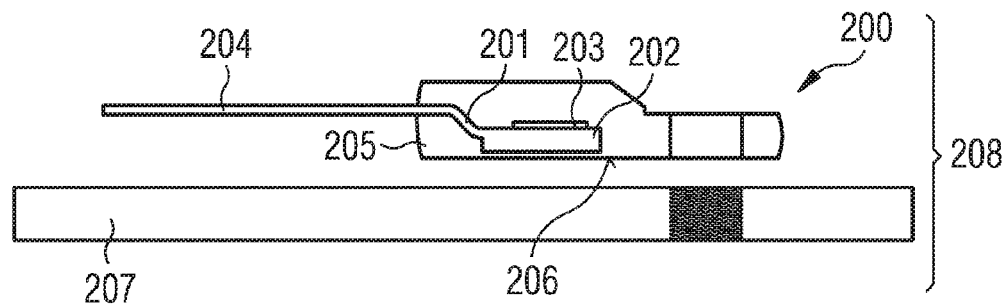

ELECTRONIC DEVICE AND METHOD OF MANUFACTURING THE SAME

TECHNICAL FIELD

Various embodiments relate to an electronic device, in particular an electronic device comprising a switching element, and to a method of manufacturing an electronic device.

BACKGROUND

In the field of electronic devices (e.g. power devices for the automotive field) often parasitic capacities are of detrimental effect in particular in case of high frequency devices. In case of increasing switching frequencies of the electronic devices the losses increase due to the parasitic capacity.

SUMMARY

Various embodiments provide an electronic device, wherein the electronic device comprises a mounting surface configured to mount the electronic device to an external structure and having a first size; a backside electrode having a second size and having arranged thereon a die electrically connected to the backside electrode; wherein the first size is at least three times the second size.

Furthermore, various embodiments provide an electronic module comprising an electronic device according to an exemplary embodiment, and a heat sink, wherein the mounting surface is mounted on the heat sink.

Moreover, various embodiments provide a method of manufacturing an electronic device, wherein the method comprises providing a carrier comprising an electrically conductive area, wherein the electrically conductive area has a second size; mounting a die onto the electrically conductive area; and at least partially encapsulating the carrier and the die by an encapsulating material and forming a mounting surface on a backside of the encapsulated electronic module, wherein the mounting surface has a first size, wherein the first size is at least three times the second size.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which:

FIGS. 1A and 1B schematically show a comparison of lead frames according to an exemplary embodiment and a common lead frame;

FIG. 2 schematically shows a side view of an electronic device according to an exemplary embodiment;

DETAILED DESCRIPTION

Figure 3:
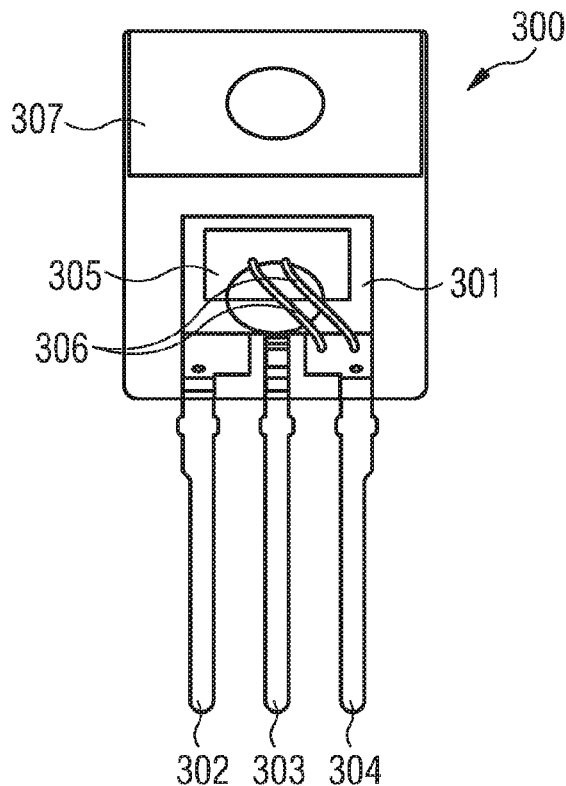
FIG. 3 schematically shows a top view of an electronic device according to an exemplary embodiment.

In the following further exemplary embodiments of an electronic device and method of manufacturing an electronic device are described. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various embodiments provide an electronic device comprising a backside electrode (e.g. a die pad of a lead frame) having arranged thereon a die, e.g. a (power) transistor or (power) diode, and further comprising an (external) mounting surface, configured for mounting the electronic device to an external mounting structure, wherein the mounting surface has a first size and the die pad has a second size, wherein the first size is at least three times the second size.

The term "backside electrode" may particularly denote an electrically conductive area or region configured or adapted to electrically contact a conductive terminal or conductive pin of a die. For example, the backside electrode may be connected to a source or drain contact or terminal of the die.

The term "mounting surface" may particularly denote an area or portion of a main surface of the electronic device configured or adapted to mount the electronic device onto an external mounting structure, like a heat sink. It should be noted that the mounting surface may be formed by the complete backside of the electronic device and may as well overlap with the backside electrode. That is, in a view direction (substantially) perpendicular to the backside the backside electrode and the mounting surface may lie behind each other. Typically the mounting surface forms a main heat dissipation path to an external mounting structure, e.g. an external heat sink.

In particular, the size may be defined in a plane parallel to a main surface of the mounting surface and/or a backside electrode. In particular, the backside electrode may be formed by a die pad, e.g. of a lead frame, i.e. may be the region or portion the die is arranged on or is intended for arranging the die. In particular, the mounting surface and/or the backside electrode may be metallic or made of an at least thermal conductive material. For example, the external structure may be a heat sink or an external mounting structure of an automobile, for example. In particular, the electronic device may be part of an AD/DC or DC/DC conversion unit of a power application or any other power application. In particular, the die may be an integrated chip like a (power) transistor or (power) diode and forming part of a converter unit. In particular, the electrode may be connected to a pin forming an external connection.

In particular, the backside electrode may be a die pad and/or may be a portion of a lead frame. The backside electrode may comprise an electrically conductive material, e.g. a metal like copper, aluminum or the like or a semiconductor.

In other words the term "backside" may particularly denote the side or main surface which is mounted to an external surface. It should be noted that the respective (backside) electrode may be connected to a low electrical potential, a high electrical potential or may be connected to ground. Preferably, the respective potential may be the high potential of the electronic device, e.g. in the range of 100 V to 800 V, e.g. about 400 V, in case of a power device In particular, the electronic device may be used in an electronic module, like a power electronic module. In particular, the electronic module may comprise a plurality of electronic devices. In particular, the heat sink may comprise an electrically and/or thermal conductive material. For example, the electronic module may form a power electronic module, comprising one or a plurality of transistors or diodes and configured to convert electrical energy. For example, the electronic module or the electronic device(s) may be configured to switch voltages in the range of 100 V to 1000 V or even higher, e.g. about 400 V.

By providing an electronic device having a relatively small backside electrode compared to the mounting surface it may be possible to reduce electrical losses, particularly due to reduced parasitic capacities. These parasitic capacities are generally formed between the backside electrode and an external electrically conductive area or portion. These reduced parasitic capacities may be specifically advantageous in case of high frequencies which induces high electrical losses and thus to a high waste heat production due to the performed switching. When increasing the ratio of the mounting surface area (or size) and the backside electrode area (or size) the heat dissipation via the backside electrode may be reduced on the one hand but at the same time this reduction (of the heat dissipation or transmission path) may be over compensated by the reducing of the waste heat production (due to the reduced parasitic capacities at high switching frequencies). Thus, in total the losses may be reduced and the general performance of the electronic device may be increased.

In the following exemplary embodiments of the electronic device are described. However, the features and elements described with respect to these embodiments can be combined with exemplary embodiments of the method of manufacturing an electronic device.

According to an exemplary embodiment of the electronic device the first size is at least five times the second size.

In particular, the first size may be at least ten times the size of the second size, preferably at least 20 times the second size.

According to an exemplary embodiment the electronic device further comprises an encapsulation encapsulating at least partially the electronic device.

In particular, the encapsulation may be formed by a molding or resin material. It should be noted that the encapsulation may be formed by a single material, by a compound or by a plurality of materials, e.g. may be formed by a multilayer structure. In particular, the encapsulation may encapsulate the backside electrode, the die arranged thereon and may form part of or the complete mounting surface.

According to an exemplary embodiment of the electronic device the encapsulation is formed by an encapsulation material at least partially forming the backside of the electronic device.

In particular, the encapsulation material may be a molding, resin or lamination material. For example, the backside of the electronic device and/or of the mounting surface may be covered or may be formed by the encapsulation material. The backside of the electronic device may be in particular the side which is configured to be connected to an external mounting structure, while a frontside of the electronic device may be the opposite main surface of the electronic device.

According to an exemplary embodiment of the electronic device the encapsulation comprises a plurality of encapsulation materials, wherein a first encapsulation material covers the backside of the backside electrode and a second encapsulation material covers a frontside of the electronic device.

In particular, the first and the second encapsulation material may be different materials.

According to an exemplary embodiment of the electronic device the first encapsulation material has a different dielectric constant than the second encapsulation material.

In particular, the first encapsulation material may have a lower dielectric constant than the second encapsulation material. Thus, it may be possible to further decrease a parasitic capacity formed by the backside electrode and an (external) mounting structure.

Furthermore, it may be possible to tailor the performance of the electronic device by choosing the encapsulation material to have specific dielectric constants and/or other physical characteristics.

According to an exemplary embodiment of the electronic device the first encapsulation material has a different specific heat conductivity than the second encapsulation material.

In particular, the first encapsulation material may have a higher specific heat conductivity than the second encapsulation material. Thus, it may be possible to increase a heat dissipation from the electronic device to an (external) mounting structure (like a heat sink).

According to an exemplary embodiment of the electronic device the mounting surface and the backside surface partially overlap in area.

In the following specific embodiments of the electronic device and the method of manufacturing an electronic device will be described in more detail with respect to the figures.

FIGS. 1A and 1B schematically show a comparison of lead frames according to an exemplary embodiment and a common lead frame. In particular, FIG. 1A shows a lead frame 100 comprising a die pad 101 having a first size, e.g. in the range of 10 mm$^2$ to 40 mm$^2$, according to an exemplary embodiment. Furthermore, the lead frame 100 comprises three leads 102, 103 and 104, which may be used for electrically connecting a (power) transistor arranged on the die pad 101 and used for connecting the transistor to the environment.

FIG. 1B shows a common lead frame 110 for comparison reasons comprising as well a die pad 111 having a size, e.g. in the range of 20 mm$^2$ to 80 mm$^2$ (dotted lines 115) compared to the size of the die pad 101 as shown in FIG. 1A (solid lines 116 of FIG. 1B). Furthermore, the lead frame 110 comprises three leads 112, 113 and 114, which may be used for electrically connecting a (power) transistor arranged on the die pad 111 and used for connecting the transistor to the environment.

FIG. 2 schematically shows a side view of a detail of an electronic device 200 according to an exemplary embodiment. In particular, FIG. 2 shows the electronic device 200 comprising a lead frame 201 comprising a die pad 202, having a second size and having arranged thereon a die (e.g. including a power transistor) 203 and leads 204 to which the die 203 is electrically connected. In addition the electronic device is encapsulated 205 by an encapsulation material, e.g. a mold compound, forming a mounting surface 206. In particular, the mounting surface 206 is formed on a backside of the electronic device 200 and having a first size (defined by the total backside of the electronic device). The first size of the mounting surface 206 is at least three times the second size of the die pad 202.

Furthermore, the electronic device 200 may be connected to an external heat sink 207 and thus forming an electronic module 208. It should be noted that while the heat dissipation or heat transmission may be reduced by the decreased size of the die pad (forming a backside electrode) the parasitic capacity formed by the backside electrode and an external element or unit (like the heat sink) may be reduced as well. This reduction in the parasitic capacity may reduce the production of waste heat even in case of high switching frequencies (e.g. in the range of 100 MHz to 300 MHz, particularly in the range of 180 MHz to 240 MHz).

FIG. 3 schematically shows a top view of an electronic device 300 according to an exemplary embodiment. In particular, the electronic device 300 comprises a lead frame having a die pad 301 and a plurality of leads 302, 303 and 304. Furthermore, a die 305 is arranged on and electrically connected to the die pad 301. In addition, the die 305 is electrically connected to one of the leads 304 via bond wires 306. Furthermore, the lead frame and the die 305 are at least partially encapsulated by an encapsulation 307 forming a mounting surface on the backside of the electronic device.

Figure 4:
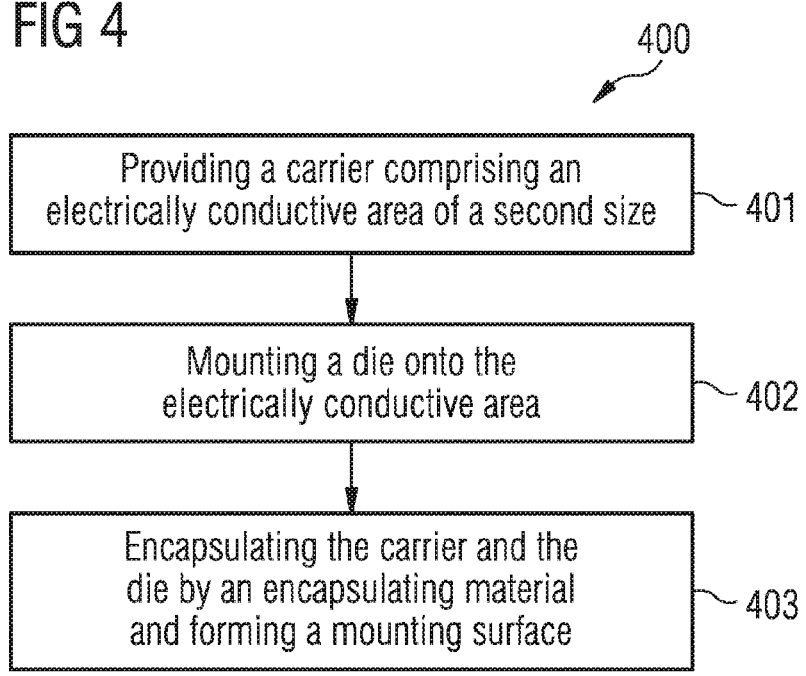
FIG. 4 illustrates a flowchart of a method of manufacturing an electronic device according to an exemplary embodiment.

FIG. 4 illustrates a flowchart of a method 400 of manufacturing an electronic device according to an exemplary embodiment. In particular, the method comprises providing a carrier comprising an electrically conductive area, wherein the electrically conductive area has a second size (step 401). Furthermore, a die is onto the electrically conductive area (step 402). Subsequently, the carrier and the die is at least partially encapsulated by an encapsulating material forming a mounting surface on a backside of the encapsulated electronic module (step 403), wherein the mounting surface has a first size. In particular, the first size is at least three times the second size.

It should also be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic device comprising:
   a mounting surface configured to mount the electronic device to an external structure and having a first size;
   a backside electrode having a second size and having arranged thereon a die electrically connected to the backside electrode;
   wherein the first size is at least three times the second size; and
   the electronic device further comprising:
     an encapsulation encapsulating at least partially the electronic device wherein the encapsulation is formed by an encapsulation material at least partially forming the backside of the electronic device and
     wherein a first encapsulation material covers the backside of the backside electrode and a second encapsulation material covers a frontside of the electronic device.

2. The electronic device according to claim 1, wherein the first size is at least five times the second size.

3. The electronic device according to claim 1, wherein the first encapsulation material has a different dielectric constant than the second encapsulation material.

4. The electronic device according to claim 1, wherein the first encapsulation material has a different specific heat conductivity than the second encapsulation material.

5. The electronic device according to claim 1, wherein the mounting surface and the backside surface partially overlap in area.

6. An electronic module comprising
   an electronic device according to claim 1, and a heat sink, wherein the mounting surface is mounted on the heat sink.

7. A method of manufacturing an electronic device, the method comprising:
   providing a carrier comprising an electrically conductive area, wherein the electrically conductive area has a second size;
   mounting a die onto the electrically conductive area; and
   at least partially encapsulating the carrier and the die by an encapsulating material forming a mounting surface on a backside of the encapsulated electronic module,
   wherein a first encapsulating material forms the mounting surface on the backside of the electronic module and a second encapsulating material forms a frontside of the electronic module
   wherein the mounting surface has a first size,
   wherein the first size is at least three times the second size.

* * * * *